United States Patent
Yuan et al.

(10) Patent No.: US 7,812,353 B2
(45) Date of Patent: Oct. 12, 2010

(54) FRONT AND BACKSIDE PROCESSED THIN FILM ELECTRONIC DEVICES

(75) Inventors: Hao-Chih Yuan, Madison, WI (US); Guogong Wang, Madison, WI (US); Mark A. Eriksson, Madison, WI (US); Paul G. Evans, Madison, WI (US); Max G. Lagally, Madison, WI (US); Zhenqiang Ma, Middleton, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 88 days.

(21) Appl. No.: 12/042,066

(22) Filed: Mar. 4, 2008

(65) Prior Publication Data

US 2008/0315253 A1   Dec. 25, 2008

Related U.S. Application Data

(62) Division of application No. 11/276,065, filed on Feb. 13, 2006, now Pat. No. 7,354,809.

(51) Int. Cl.
*H01L 29/73* (2006.01)
*H01L 29/772* (2006.01)
*H01L 29/78* (2006.01)

(52) U.S. Cl. ............... 257/74; 257/351; 257/565; 257/E27.027

(58) Field of Classification Search ................ 438/157; 257/74, E27.027
See application file for complete search history.

(56) References Cited

U.S. PATENT DOCUMENTS

| | | | | |
|---|---|---|---|---|
| 4,612,083 A | * | 9/1986 | Yasumoto et al. | ............ 438/59 |
| 5,376,559 A | * | 12/1994 | Mukai et al. | ............... 438/283 |
| 6,054,734 A | * | 4/2000 | Aozasa et al. | ............... 257/315 |
| 6,765,227 B1 | | 7/2004 | Yu et al. | |
| 7,038,277 B2 | | 5/2006 | Chu et al. | |
| 2001/0019371 A1 | | 9/2001 | Zavracky et al. | |
| 2005/0054121 A1 | | 3/2005 | Handy et al. | |
| 2005/0082526 A1 | | 4/2005 | Bedell et al. | |
| 2006/0038182 A1 | | 2/2006 | Rogers et al. | |
| 2006/0134893 A1 | | 6/2006 | Savage et al. | |

FOREIGN PATENT DOCUMENTS

WO   WO 2005/122285   12/2005

OTHER PUBLICATIONS

U.S. Appl. No. 60/577,077, filed Feb. 23, 2006, Rogers et al.
U.S. Appl. No. 60/601,061, filed Feb. 23, 2006, Rogers et al.
U.S. Appl. No. 60/650,305, filed Feb 23, 2006, Rogers et al.

(Continued)

*Primary Examiner*—Stephen W Smoot
(74) *Attorney, Agent, or Firm*—Bell & Manning, LLC

(57) ABSTRACT

This invention provides methods for fabricating thin film electronic devices with both front- and backside processing capabilities. Using these methods, high temperature processing steps may be carried out during both frontside and backside processing. The methods are well-suited for fabricating back-gate and double-gate field effect transistors, double-sided bipolar transistors and 3D integrated circuits.

14 Claims, 4 Drawing Sheets

OTHER PUBLICATIONS

U.S. Appl. No. 60/663,391, filed Feb. 23, 2006, Rogers et al.
U.S. Appl. No. 60/677,617, filed Feb. 23, 2006, Rogers et al.
Xue, Lei et al., "Three-Dimensional Integration: Technology, Use, and Issues for Mixed-Signal Applications," IEEE Transactions on Electron Devices, vol. 50, No. 3, pp. 601-609, Mar. 2003.
Menard, E. et al., "A printable form of silicon for high performance thin film transistors on plastic substrates," Appl. Phys. Lett., vol. 84, No. 26, pp. 5398-5400, published online Jun. 17, 2004.
Menard, E. et al., "Bendable single crystal silicon thin film transistors formed by printing on plastic substrates," Appl. Phys. Lett., vol. 86, pp. 093507-1-093507-3 published online Feb. 25, 2005.
Zhu, Z.-T et al., "Spin on dopants for high-performance single-crystal silicon transistors on flexible plastic substrates," Appl. Phys. Lett., vol. 86, pp. 133507-1-133507-3, published online Mar. 23, 2005.
Sun, Yugang et al., "Bendable GaAs metal-semiconductor field-effect transistors formed with printed GaAs wire arrays on plastic substrates," Appl. Phys. Lett., vol. 87, pp. 083501-1-083501-3, published online Aug. 15, 2005.
Jeon, SeoKwoo et al., "Three-Dimensional Nanofabrication with Rubber Stamps and Conformable Photomasks," Adv. Mater., vol. 16, No. 15, pp. 1369-1373, Aug. 4, 2004.
Loo, Yueh-Lin et al., "Soft, conformable electrical contacts for organic semiconductors: High-resolution plastic circuits by lamination," PNAS, vol. 99, No. 16, pp. 10252-10256, Aug. 6, 2002.
Reif, Rafael et al., "Fabrication Technologies for Three-Dimensional Integrated Circuits," Proceedings of the International Symposium on Quality Electronic Design (ISQED'02), IEEE, Apr. 2002.
Yuan, Hao-Chih, "Silicon-Based Nanomembrane Materials: The Ultimate in Strain Engineering," 2006 Topical Meeting on Silicon Monolithic Integrated Circuits in RF Systems, sponsored by the IEEE Microwave Theory and Techniques Society, San Diego CA, pp. 327-333, Jan. 18-20, 2006.
Lauer, Issac, "Double-Sided CMOS Fabrication Technology," Department of Electrical Engineering and Computer Science, Massachusetts Institute of Technology, pp. 1-66, Aug. 28, 2001.
International Search Report dated Mar. 26, 2008.
G.K. Celler, "Frontiers of silicon-on-insulator", Journal of Applied Physics, vol. 93 No. 9, May 1, 2003; pp. 4955-4978.
A. Ikeda, "Design and Measurements of Test Element Group Wafer Thinned to 10 am for 3d System in Package", Conference on Microelectronic Test Structures, vol. 17, Mar. 2007.

* cited by examiner

FRONT AND BACKSIDE PROCESSED THIN FILM ELECTRONIC DEVICES

CROSS-REFERENCE TO RELATED APPLICATIONS

This application is a division of U.S. patent application Ser. No. 11/276,065, filed Feb. 13, 2006, now U.S. Pat. No. 7,354,809, the entire disclosure of which is hereby incorporated by reference in its entirety and for all purposes as if fully set forth herein.

STATEMENT OF GOVERNMENT RIGHTS

Research funding was provided for this invention by the U.S. Army under grant number W911NF-041-1-0389; U.S. Department of Energy under grant number DE-FG02-03ER46028; and the National Science Foundation under grant number 0079983. The United States government has certain rights in this invention.

FIELD OF THE INVENTION

This invention pertains generally to the field of thin film transistors and methods of processing the same.

BACKGROUND

Flexible circuits and electronic devices that combine plastic substrates with thin layers of semiconductors are an important emerging technology. These flexible circuits and the devices that incorporate them have advantages that are difficult or impossible to achieve using conventional semiconductor processing techniques and materials. Specifically, these circuits are mechanically flexible, lightweight, and durable. In addition, flexible circuits have the potential to be mass produced at a relatively low cost. Various fields and applications in which flexible electronics have great potential include displays, solar cells, smart cards, radiofrequency identification cards (RFID), and medical applications. Perhaps the largest market potential for flexible circuits is in the active matrix flat panel display market due to its never-ending demand for lightweight and robust wireless technologies.

Recently, a dry printing transfer printing technique for producing bendable silicon transistors on plastic substrates has been proposed. (See, for example, Menard et al., Appl. Phys. Lett. 86, 93507-1 (2005). This technique uses a poly (dimethylsiloxane) (PDMS) elastomer stamp to lift a thin single crystal silicon layer from a silicon wafer and transport the silicon layer to a plastic substrate. Using this technique, high-temperature processing steps must be performed on the silicon layer before transfer because the elastomer stamp and the plastic substrate will not withstand high processing temperatures. As a result this technique only allows one side of the silicon thin film to be processed. For this reason, this technique is unsuitable for the production of thin film electronics that require front- and backside processing. Such devices include double gate field effect transistors (FETs), back-gate FETs, complimentary metal oxide semiconductor (CMOS) devices having multiple oppositely-facing p-channel and n-channel transistors, double-sided bipolar junction transistors (BJTs) and heterojunction bipolar transistors (HBTs).

One emerging field where double-sided thin film electronics are highly desirable is in the field of three-dimensional (3D) integrated circuits. These 3D integrated circuits are made from stacked layers of semiconductor single crystals having buried transistor structures and vertical interconnects to provide vertically integrated circuits with a high transistor density per volume. Examples of vertically integrated 3D circuits are described in Xue et al., IEEE Transactions on Electron Devices, 50, 601-609 (2003). These 3D devices are made from multilayers of planar devices integrated into silicon device wafers with vertical interconnects providing conductivity in the vertical direction.

SUMMARY

This invention provides methods for fabricating thin film electronic devices with both front- and backside processing capabilities. Using these methods, high temperature processing steps may be carried out during both frontside and backside processing. The methods are well-suited for fabricating double-sides devices and 3D integrated circuits.

The thin film electronic devices may be fabricated from a device substrate that includes an active layer composed of a single crystal semiconductor supported on a sacrificial layer. The method entails the steps of integrating one or more device components into an upper surface of the active layer, releasing the active layer from the sacrificial layer and lifting the released active layer thereby exposing the lower surface of the active layer, and integrating one or more device components into the lower surface of the active layer. Lifting the released active layer is carried out by contacting the released active layer with a host substrate, to which the upper surface of the active layer adheres. These processing steps allow the processing of the lower surface of the active layer to be carried out while the active layer is supported by the host substrate. In some embodiments, the host substrate itself forms part of an electronic device. In other embodiments, the host substrate provides a temporary support on which processing of the active layer is carried out prior to a subsequent transfer of the active layer (now processed on its opposing upper and lower surfaces) to a circuit substrate, such as a flexible plastic film.

For the purpose of this disclosure, the term "device components" refers to a component of an electrical or an electromechanical device. Examples of device components include, but are not limited to, transistors, transistor components (e.g., source, gate, drain, emitter, base, collector, electrodes, and the like), resistors, inductors, and capacitors.

Thin film electronic devices that may be made using the present methods include, but are not limited to, double gate FETs, back-gate FETs, CMOS devices having multiple oppositely-facing p-channel and n-channel transistors, double-sided BJTs and HBTs.

The methods also may be used to produce 3D integrated circuits from stacked thin films having buried integrated transistor structures, separated by isolation layers and connected by vertical interconnects. To fabricate a 3D integrated circuit an isolation layer may be deposited over the device components of the upper or lower surface of a first active layer, fabricated as described above. The isolation layer may be composed of a material with a high thermal conductivity, such as AlN, carbon, or diamond. A second active layer is then transferred onto the isolation layer and in-plane and out-of-plane interconnects are formed in the resulting stacked structure to provide vertical device integration with buried transistor structures. The second active layer may be formed in the same manner as the first, such that the second active layer has device components integrated into its opposing upper and lower surfaces prior to transfer onto the isolation layer on the first active layer. Alternatively, the second active layer may have device components integrated into its upper surface while it is supported by a sacrificial layer. The second active layer may then be released from the sacrificial layer and contacted with the isolation layer on the first active surface, whereby the isolation layer acts as a host substrate, lifting the released second active layer. Device components may then be integrated into the, now exposed, lower surface of the second active layer, which is now supported by the isolation layer. This process may be repeated until a 3D stacked structure having the desired number of active layers is produced.

The 3D integrated circuits made in accordance with the present methods include devices wherein components made from different materials or different device structures are placed on different active layers in the stacked structure.

Further objects, features and advantages of the invention will be apparent from the following detailed description when taken in conjunction with the accompanying drawings.

DETAILED DESCRIPTION

Figure 1:
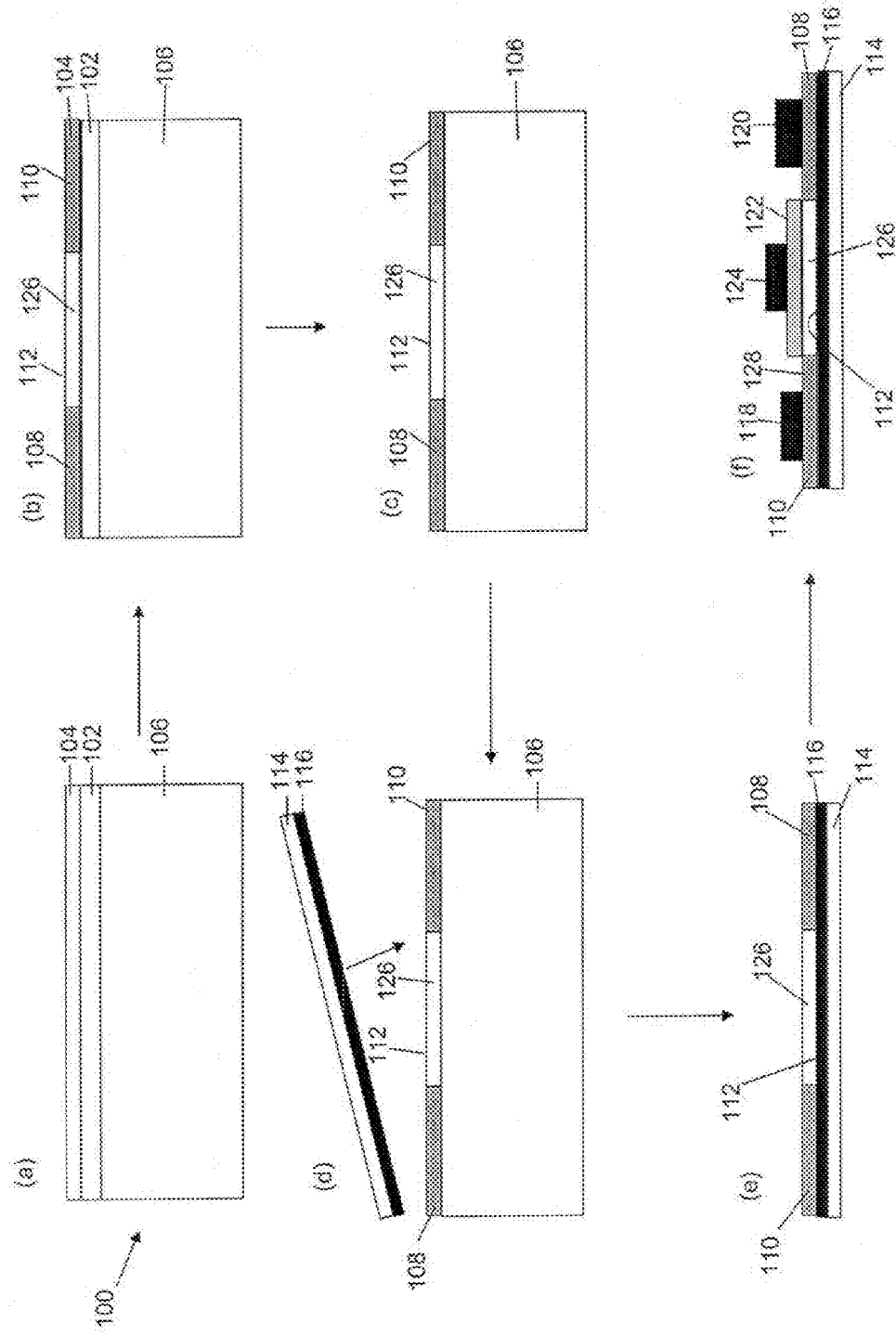
FIG. 1 is a schematic diagram showing a method for fabricating a back-gate field effect transistor.

This invention relates to methods for making thin film electronic and electro-mechanical devices, including thin film transistors (TFTs), and electronic circuits that incorporate the thin film devices. The methods allow for both front and backside processing and are well suited for the fabrication of double-sided devices and 3D integrated circuits.

In the present methods thin film devices and electronics are fabricated from a device substrate having an active layer composed of a single crystal semiconductor material supported by a sacrificial layer that is desirably capable of withstanding high (e.g., ≧500° C.) processing temperatures. The active layer has an exposed upper surface and an oppositely facing lower surface which is initially in contact with the sacrificial layer. As used herein, the terms "upper" and "lower" are used to refer to oppositely facing surfaces of the active layer. These terms are not intended to specify any particular orientation of the active layer. As will be clear from the discussion that follows, during various processing steps the "upper" surface of an active layer may actually be positioned face-down and the "lower" surface of an active layer may actually be positioned face-up.

As an initial step in the present methods, one or more device components are integrated into the upper surface of the active layer while the active layer is supported by the underlying sacrificial layer. The active layer is then released from the sacrificial layer and transferred onto a host substrate by contacting the upper surface of the active layer with a host substrate, to which the active layer adheres, and lifting the active layer. In this transfer process, the active layer is "flipped" onto the host substrate such that the upper surface of the active layer is now face-down on the host substrate and the lower surface of the active layer is now face-up. After the transfer of the active layer to the host substrate, one or more device components may then be integrated into the lower surface of the active layer.

The single crystal semiconductor of the active layer may be composed of a single semiconductor or a semiconductor alloy. Examples of semiconductors that may be used in the active layer include, but are not limited to, Group IV semiconductors (e.g., silicon (Si) and germanium (Ge) and Group III-IV semiconductors (e.g., gallium arsenide (GaAs)). SiGe is an example of a semiconductor alloy that may be used in the active layer. The active layer itself may be a single layer or multilayered structure. For example, the active layer may be composed of a semiconductor alloy layer sandwiched between two layers of semiconductor. Alternatively, the active layer may include a layer composed of a semiconductor layer sandwiched between two semiconductor alloy layers. In one embodiment, the active layer is composed of a layer of SiGe alloy sandwiched between two Si layers. For the purposes of this disclosure, the individual layers in an active layer that includes multiple semiconductor layers (such as a layer of semiconductor alloy sandwiched between two layers of semiconductor) will be referred to as active sublayers.

The active layer is desirably thin and mechanically flexible. In some embodiments the active layer has a thickness of no more than about 700 nm. This includes embodiments where the active layer has a thickness of no more than about 500 nm, no more than about 300 nm, no more than about 200 nm, no more than about 100 nm, no more than about 50 nm, or even no more than about 30 nm.

The sacrificial layer initially supporting the active layer may be composed of an etchant-sensitive material that may be eliminated by wet or dry etching to release the active layer. For example, a sacrificial layer composed of silicon dioxide could be etched away using HF liquid or vapor to release an overlying active layer of, for example, Si. Alternatively, the sacrificial layer may include a defect layer which breaks at elevated temperatures. For example, hydrogen implantation could be used to produce a defect layer as a sacrificial layer. When the sacrificial layer is heated, defects propagate in the defect layer until a break is formed through the sacrificial layer. Any portion of the sacrificial layer that remains attached to the active layer is then removed, thereby releasing the active layer.

Semiconductor-on-insulator substrates (SOIs) that include a handle wafer, a buried insulator (e.g., a buried oxide) layer and a thin semiconductor layer are well-suited for use as device substrates. In the SOIs, (which are well-known and commercially available) the thin semiconductor layer serves as the active layer and the buried insulator serves as the sacrificial layer. Examples of SOIs include, but are not limited to, silicon-on-insulator, silicon-on-sapphire, SiGe-on-insulator and germanium-on-insulator substrates.

The host substrate onto which the active layer is transferred may be an organic or inorganic substrate. The host substrate is characterized by at least one surface to which the active layer adheres. Generally, the host substrate will be coated with an adhesive coating to promote adhesion of the active layer. The host substrate may be incorporated into a final electronic or electro-mechanical device. For example, the host substrate may be an electrically conductive substrate (e.g., a metal coated polymer) having a dielectric adhesive coating on its surface. In such embodiments, the adhesive may be used as the gate dielectric and the electrically conductive substrate as the gate electrode in an FET. Alternatively, the host substrate may be a temporary substrate on which the active layer undergoes further processing before being transferred to another host substrate. The active layer may be "flipped" from host substrate to host substrate in a series of transfer steps, and one or more transistor components may be integrated into the upper and/or lower surface at each step, until the processing of the active layer is complete.

Suitable organic host substrates include thin, flexible polymer films. Poly(ethyleneteraphthalate) (PET) is an example of a suitable polymer substrate that may be used in the fabrication of thin film transistors. Because polymer host substrates, such as PMMA or rubber substrates, do not stand up well under high temperature processing conditions, such as thermal annealing, it is desirable to complete all high temperature processing steps on the active layer prior to transferring the active layer to a polymer host substrate.

If additional high temperature processing steps are to be carried out after the active layer is released from the sacrificial layer, it may be desirable to use an inorganic host that can withstand high temperatures. Examples of suitable inorganic host substrates include, but are not limited to, semiconductor and semiconductor oxide substrates. Specific examples of such substrates include crystalline silicon, silicon dioxide, sapphire, GaN, and the like. Any adhesive coating remaining between the inorganic host substrate and the active layer after transfer may optionally be dissolved prior to carrying out high temperature device processing steps.

The step of integrating a device component into the surface of an active layer is used broadly to refer to any processing step or steps used to form one or more electronic or electromechanical device components in the active layer. Transistor components that may be fabricated by these processing steps include the source, drain and gate of a field effect transistor, the emitter, collector and base of a bipolar transistor, and their associated electrical connections. The particular processing steps used and the order of the processing steps will depend on the nature of the device to be fabricated. However, the processing steps will typically include a combination of one or more of the following: doping the active layer, annealing the active layer, patterning and etching the active layer and depositing materials (e.g., dielectrics and electrical contacts) on the active layer.

Doping the active layer may entail n-doping and/or p-doping the active layer to define n-wells, p-wells; source, gate and drain regions; or emitter, base and collector regions in the active layer. The resulting doped regions may extend all the way, or only partially, through the active layer. For example, if the active layers is itself a multilayered structure, the doped regions may be limited to one or more of the sublayers of the active layer. Doping may be carried out using well-known techniques, including ion implantation and spin-on dopant techniques. Doping typically will be followed by a high temperature annealing step to activate the doped regions of the active layer. For example, annealing may be carried out at temperatures of at least about 450° C. This includes annealing steps conducted at least about 500° C., at least about 600° C., and at least about 700° C.

Patterning and etching the surface of the active layer may be carried out using well-known lithographic and etching techniques. For example, patterning and etching the surface may entail depositing a resist on the surface of the active layer, lithographically patterning the resist to define a mask over the surface, and etching the exposed regions of the active layer surface to fabricate device components.

Materials that may be deposited onto the surface of the active layer include dielectric materials (e.g., for use in forming a gate dielectric) and electrical contact materials (e.g., indium-tin-oxide (ITO) and/or metals, such as gold and titanium) for use as electrodes. Conventional deposition techniques (e.g., chemical vapor deposition) may be used.

Because the present methods allow device components to be integrated into both the upper and lower surfaces of the active region, the methods are well-suited for the fabrication of double sided devices including, but not limited to, double gate MOSFETs, back-gate MOSFETs, CMOS devices, and double sided BJTs and HBTs. By making the various device layers sufficiently thin and selecting a suitable flexible final host substrate, these transistors may be mechanically flexible, thin film transistors.

The methods are also well-suited for fabricating 3D integrated circuits. These 3D integrated circuits are composed of a stack of active layers, of the type described herein, separated by isolation layers. Buried transistor structures integrated into the upper and lower surfaces of the active layers are connected by vertically integrated electrical interconnects. Using the methods described above, device components may be integrated into the upper and lower surfaces of the first active layer in the stack. An isolation layer may then be deposited over the first active region and vertical electrical interconnects may be integrated into the isolation layer. The vertical interconnects may be formed, for example, using a dual Damascene process as described in Xue et al., IEEE Trans. Electron Devices, 50, 601-609 (2003), the entire disclosure of which is incorporated herein by reference. A second active layer may then be transferred onto the isolation layer. The second active layer may have one or more device components integrated into its upper and lower surfaces (using the methods described herein) before being transferred onto the isolation layer, to which the second active layer adheres. Alternatively, the isolation layer may act as a host substrate for a second active layer that has been released from an underlying sacrificial layer after having one or more transistor components integrated into its upper surface. In such embodiments, one or more transistor components may be integrated into the lower surface of the second active layer after it has been transferred (i.e., flipped) onto the isolation layer. This process may be repeated until a stack having the desired number of active layers is fabricated.

FIGS. 1-4 are schematic diagrams showing how to make various transistor structures in accordance with the methods of this invention. The examples represented by these figures are intended to illustrate the invention without limiting it.

FIG. 1 is a schematic diagram showing the steps involved in the production of a back-gate thin film transistor. The device substrate 100 is a silicon-on-insulator (SOI) with a thin buried silicon oxide layer 102 (~200 nm) sandwiched between a thin silicon single crystal active layer 104 (~200 nm) and a silicon handle wafer 106. In an initial processing step (step b), a source region 108 and a drain region 110 are fabricated by n-doping the upper surface 112 of active layer 104. This may be accomplished by applying a photoresist over upper surface 112 (e.g., spin-coating), creating a mask exposing source and drain regions 108, 110 using photolithography, doping the source and drain regions using ion implantation and, finally, removing the mask. The doping is following by a high temperature anneal. Gate region 126 may be doped by repeating the procedure. An HF etch (step c) is then used to remove buried oxide layer 102, releasing the active layer 104 which falls onto underlying handle wafer 106. A host substrate composed film of gold-coated PET (gold-coating not depicted) 114 and a dielectric adhesive layer 116 is brought into contact with the upper surface 112 of active layer 104 (step d). Active layer 104 is then flipped onto the host substrate (step e). In this design, the gold-coated PET 114 provides a back-gate electrode and the dielectric adhesive layer 116 provide a back-gate dielectric. Finally, metal contacts 118, 120 are deposited over source region 108 and drain region 110 and a second gate dielectric 122 and second gate electrode 124 are deposited over gate region 126 (step f). This may be accomplished by applying a photoresist over lower surface 128 (e.g., spin-coating), creating a mask exposing source and drain regions 108, 110 using photolithography, and etching and depositing the dielectric and contacts (e.g., using chemical vapor deposition). For simplicity, FIG. 1 shows the formation of a single transistor in the active region. However, a CMOS including a p-type and a n-type FET integrated into the same surface of the active region could also be formed using the present methods.

Figure 2:
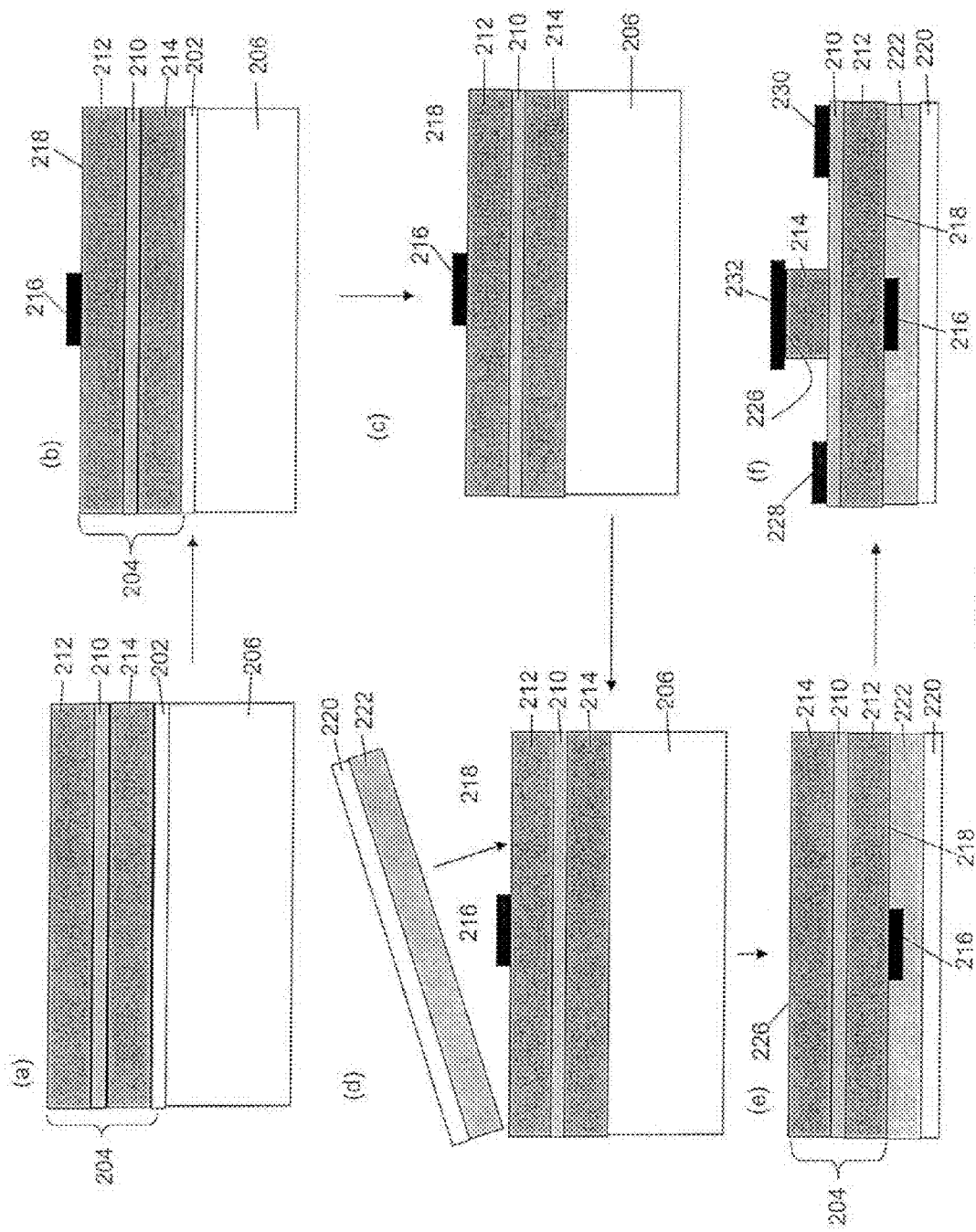
FIG. 2 is a schematic diagram showing a method for fabricating a double-sided, collector-up bipolar heterojunction transistor.

FIG. 2 is a schematic diagram showing the steps involved in the production of a double sided, collector up heterojunction bipolar junction transistor. The device substrate includes a thin buried silicon oxide layer 202 (~200 nm) sandwiched between a triple layer active layer 204 (~700 nm) and a silicon handle wafer 206. Active layer 204 is composed of three active sublayers. The sublayers are a thin p-doped SiGe layer 210 (~50 nm) sandwiched between two thin n-doped Si layers 212, 214 (~650 nm). This device substrate may be fabricated by growing (e.g., via molecular beam epitaxy) a Si/SiGe bilayer on the silicon single crystal layer of an SOI substrate and doping the layers during (or after) the growth of each layer, followed by a high temperature anneal if necessary. In an initial processing step, a metal emitter electrode 216 is deposited on the upper surface 218 of active layer 204 (step b). An HF etch is then used to remove buried oxide layer 202, releasing the active layer 204 which falls onto silicon handle wafer 206 (step c). A host substrate composed film of PET 220 and a dielectric adhesive layer 222 is brought into contact with the upper surface 218 of active layer 204 (step d). Active layer 204 is then flipped onto the host substrate (step e). The lower surface 226 of active layer 204 is then etched down to SiGe layer 210, after depositing collector electrode 232 to form a collector from Si layer 214. Base electrodes 228, 230 are than deposited over lower surface 226.

Figure 3:
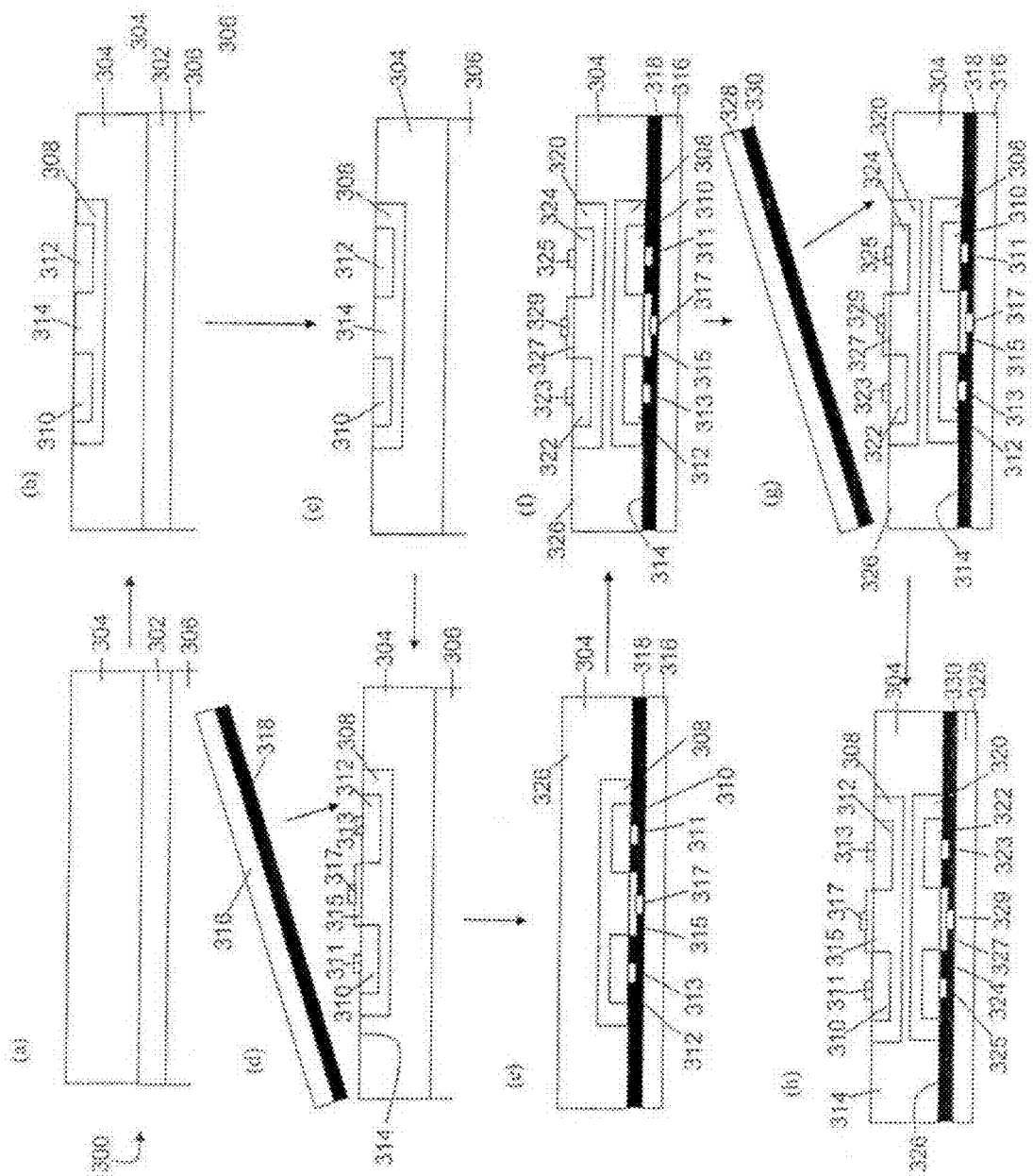
FIG. 3 is a schematic diagram showing a method for fabricating a double-sided CMOS.

FIG. 3 is a schematic diagram showing the steps involved in the production of a double-sided CMOS. The device substrate 300 is a silicon-on-insulator (SOI) with a thin buried silicon oxide layer 302 (~200 nm) sandwiched between a thin silicon single crystal active layer 304 (~500 nm) and a silicon handle wafer 306. In an initial processing step (step b), an n-well 308 with a p-doped source region 310 and a p-doped drain region 312 is fabricated by doping the upper surface 314 of active layer 304. This may be accomplished using standard lithography and doping techniques. The doping steps are followed by a high temperature anneal. An HF etch (step c) is then used to remove buried oxide layer 302, releasing the active layer 304, which falls onto underlying handle wafer 306. A source electrode 311, a drain electrode 313, a gate dielectric 315 and a gate electrode 317 are then deposited over upper surface 314 (step d). A first host substrate composed of a material that can withstand high temperature processing conditions, for example, a silicon dioxide layer 316 and an adhesive layer 318, is brought into contact with the upper surface 314 of active layer 304 (step d). Active layer 304 is then flipped onto the host substrate (step e). A p-well 320 with an n-doped source region 322 and an n-doped drain region 324 is fabricated by doping the lower surface 326 of active layer 304, followed by a second high temperature anneal (step f). A second source electrode 323, a second drain electrode 325, a second gate dielectric 327 and a second gate electrode 329 are then deposited over lower surface 326. A second host substrate composed of, for example, a high temperature-resistant material 328 and an adhesive layer 330 is brought into contact with the lower surface 326 of active layer 304 (step g). Active layer 304 is then flipped onto the host substrate (step b).

Figure 4:
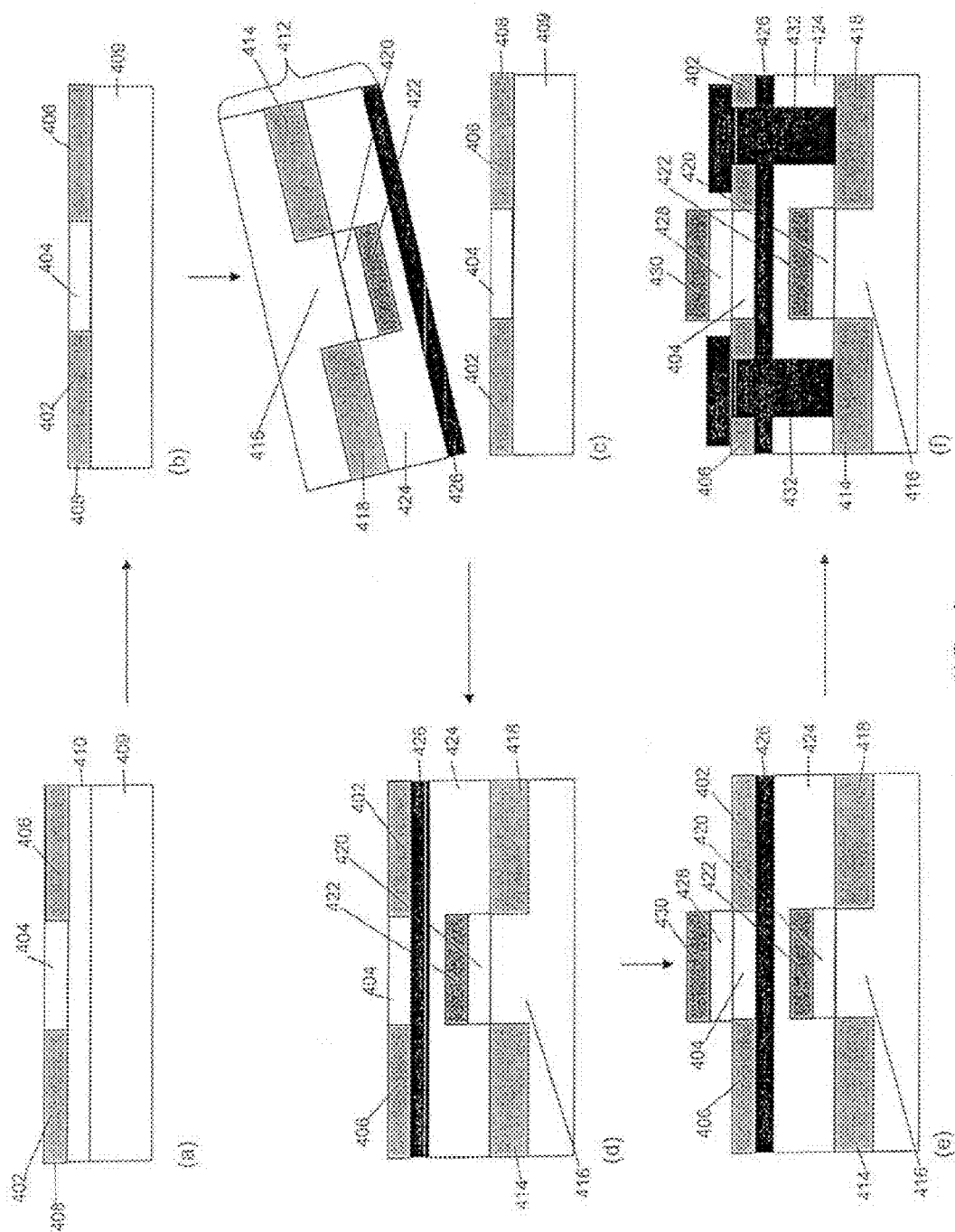
FIG. 4 is a schematic diagram showing a method for fabricating a 3D integrated circuit.

FIG. 4 is a schematic diagram showing a method for fabricating a 3D integrated circuit. For simplicity, the fabrication of only the first two thin film transistor layers are shown in this figure. Initially, a source region 402, a gate region 404 and a drain region 406 are formed in the top layer 408 of a SOI substrate (step a) using frontside processing. The underlying buried sacrificial layer 410 is then removed (step b) leaving released layer 408 on the handle wafer 409. These steps may be carried out as described with respect to steps a and b of FIG. 1. The released top layer 408 will form the second thin film transistor device layer of the 3D integrated circuit. A host substrate 412 to which layer 408 adheres is then brought into contact with layer 408 (step c) and released layer 408 is flipped onto host substrate 412 (step d). Host substrate 412 may be formed from a silicon wafer prefabricated to include a source region 414, a gate region 416, a drain region 418, a gate dielectric 420 and a gate contact 422, using conventional silicon wafer processing techniques. An isolation layer 424 of, for example, $SiO_2$, is deposited over the prefabricated silicon wafer and a layer of adhesive 426 is deposited over the isolation layer. Using backside processing, a gate dielectric 428 and a gate electrode 430 are then grown on "flipped" layer 408. Buried vertical interconnects 432 (e.g., tungsten or polysilicon interconnects) may then be formed in the resulting 3D structure using, for example, a dual Damascene process. The process of processing-releasing-flipping thin film transistor layers may be repeated until a stacked 3D structure having the desired number of device layers is formed. For simplicity, the 3D structure of FIG. 4 includes only two transistors, one in each active layer in the stack. However, more complicated structures, with many buried transistor structures per active layer may also be produced, including structures having active layers with transistors integrated into both their upper and lower surfaces. Because the structure of FIG. 4 may be produced using thin film active layers, it represents a substantial advantage over 3D integrated circuits fabricated from conventional semiconductor wafers.

It is understood that the invention is not confined to the particular embodiments set forth herein as illustrative, but embraces all such modified forms thereof as come within the scope of the following claims.

What is claimed is:

1. A collector-up bipolar junction transistor comprising:
   (a) a substrate;
   (b) an active layer disposed on the substrate, the active layer comprising a single-crystal semiconductor material and having oppositely facing first and second surfaces, wherein the active layer comprises an emitter region, a base region, and a collector region;
   (c) an emitter electrode disposed on the first surface;
   (d) a base electrode disposed on the first or the second surface;
   (e) a collector electrode disposed on the second surface; wherein the thickness of the active layer is no more than about 700 nm.

2. The transistor of claim 1, wherein the active layer is a multilayered structure comprising a SiGe alloy layer sandwiched between two silicon single crystal layers.

3. The device of claim 1, wherein the thickness of the active layer is no more than 100 nm.

4. The device of claim 1, wherein the thickness of the active layer is no more than about 50 nm.

5. A vertically integrated multiple transistor device comprising:
   (a) an active layer comprising a single crystal semiconductor material, the active layer having oppositely facing first and second surfaces, and a thickness of no more than about 300 nm;
   (b) a first transistor integrated into the first surface of the active layer; and (c) a second transistor integrated into the second surface of the active layer;

wherein the source and drain regions of the first transistor are separated from the source and drain regions of the second transistor by a layer of the single crystal semiconductor material.

6. The device of claim 5, wherein the first transistor is a p-channel MOSFET and the second transistor is an n-channel MOSFET.

7. The device of claim 5, wherein the thickness of the active layer is no more than 200 nm.

8. The device of claim 5, wherein the thickness of the active layer is no more than about 100 nm.

9. A three-dimensional thin film electronic device comprising:
  (a) a bottom active layer comprising a single crystal semiconductor material, the bottom active layer having oppositely facing first and second surfaces, and a thickness of no more than about 500 nm;
  (b) a top active layer comprising a single-crystal semiconductor material, the top active layer having oppositely facing first and second surfaces, and a thickness of no more than about 300 nm; and
  (c) one or more intermediate active layers stacked between the top and bottom active layers and comprising a single crystal semiconductor material, each intermediate active layer having oppositely facing first and second surfaces, and a thickness of no more than about 500 nm;
  (d) one or more buried device components integrated into the first and second surfaces of the one or more intermediate active layers, wherein at least one of the intermediate active layers has a thickness of no more than about 300 nm and the one or more buried device components in said at least one intermediate active layer comprise a first transistor integrated into the first surface of said at least one intermediate active layer and a second transistor integrated into the second surface of said at least one intermediate active layer, and further wherein the source and drain regions of the first transistor are separated from the source and drain regions of the second transistor by a layer of the single crystal semiconductor material, such that the at least one intermediate active layer and the first and second transistors form a vertically integrated multiple transistor device according to claim 7;
  (e) an isolation layer separating each of the active layers; and
  (f) vertically integrated interconnects providing electrical contact to the one or more buried device components.

10. The device of claim 9, wherein the thickness of each intermediate active layer is no more than about 200 nm.

11. The device of claim 9, wherein the thickness of each intermediate active layer is no more than about 30 nm.

12. The device of claim 9, wherein the thickness of each intermediate active layer is no more than 100 nm.

13. The device of claim 9, wherein the thickness of each intermediate active layer is no more than about 50 nm.

14. The device of claim 9, wherein at least one or the one or more intermediate active layers has at least one transistor integrated into its first surface and at least one transistor integrated into its second surface.

\* \* \* \* \*